United States Patent [19]

Takemae

[11] Patent Number: 4,791,610
[45] Date of Patent: Dec. 13, 1988

[54] SEMICONDUCTOR MEMORY DEVICE FORMED OF A SOI-TYPE TRANSISTOR AND A CAPACITOR

[75] Inventor: Yoshihiro Takemae, Minato, Japan

[73] Assignee: Fujitsu Limited, Kanagawa, Japan

[21] Appl. No.: 866,507

[22] Filed: May 23, 1986

[30] Foreign Application Priority Data

May 24, 1985 [JP] Japan ................................ 60-111459

[51] Int. Cl.⁴ ...................... G11C 11/24; G11C 11/34; G11C 7/00
[52] U.S. Cl. .................................... 365/149; 365/174; 365/182; 357/23.6
[58] Field of Search ............... 365/149, 174, 182, 226; 357/23.6, 23.1

[56] References Cited

U.S. PATENT DOCUMENTS

| | | | |
|---|---|---|---|
| 4,222,062 | 9/1980 | Trotter et al. | 365/149 |
| 4,467,450 | 8/1984 | Kuo | 357/23.6 |
| 4,613,889 | 9/1986 | Kuo | 365/149 |
| 4,646,118 | 2/1987 | Takemae | 357/23.1 |
| 4,686,552 | 8/1987 | Terg et al. | 357/23.6 |

FOREIGN PATENT DOCUMENTS

| | | | |
|---|---|---|---|
| 0108390 | 5/1984 | European Pat. Off. | 365/149 |
| 0121798 | 10/1984 | European Pat. Off. | 357/23.6 |
| 0145606 | 6/1985 | European Pat. Off. | 365/149 |
| 59-184555 | 10/1984 | Japan | 365/149 |
| 60-65559 | 4/1985 | Japan | 365/149 |
| 2113910 | 8/1983 | United Kingdom | 365/149 |

OTHER PUBLICATIONS

IEEE Electron Device Letters, vol. EDL-5, No. 5, May, 1984, pp. 151-153, IEEE, New York, New York, U.S., J. C. Sturm et al, "*A Three Dimensional Folded Dynamic RAM in Beam-Recrystallized Polysilicon*".

*Primary Examiner*—Stuart N. Hecker
*Assistant Examiner*—Alfonso Garcia
*Attorney, Agent, or Firm*—Armstrong, Nikaido, Marmelstein & Kubovcik

[57] ABSTRACT

A semiconductor memory (DRAM) device comprises memory cells, each of which is composed of an FET and a capacitor. The FET has an SOI structure. The capacitor is composed of a dielectric layer as an insulating layer for the SOI structure, an upper capacitor electrode as a semiconductor layer for the SOI structure, and a lower capacitor electrode as a semiconductor substrate. The substrate is biased with a voltage at an intermediate level between a first storage voltage and a second storage voltage.

16 Claims, 3 Drawing Sheets

SEMICONDUCTOR MEMORY DEVICE FORMED OF A SOI-TYPE TRANSISTOR AND A CAPACITOR

BACKGROUND OF THE INVENTION

1. Field of the Invention

The present invention relates to a semiconductor device, more particularly, to a dynamic random access memory (DRAM) comprising memory cells, each of which is composed of a transistor and a capacitor.

2. Description of the Related Art

System expansion and developments in technology have brought about an ongoing increase in the storage capacity of the DRAM, and have given rise to a requirement for reducing the size of a memory cell. In order to secure a sufficient charge in a small cell area, a trench-capacitor formed in a groove dug in a semiconductor substrate has been proposed and used as a capacitor for the charge storage of information.

Taking into consideration the demand for a high speed operation of the memory device, a silicon on insulator (SOI) structure has been proposed and adopted in the memory device which prevents an increase of the signal delay time caused by a parasitic capacitance, and decreases a memory cell area.

There are also demands for a method of increasing a capacitance of a capacitor by making a dielectric layer thin, in the device using the above-mentioned two structures, and conversely, for a method of improving the reliability of the dielectric layer by decreasing the electric field strength applied to the capacitor when a dielectric layer has the same thickness as that of the thinned dielectric layer. A DRAM device was proposed by the present inventor in EP-A-No. 0145606 (European Patent Application No. 84402560.1 filed on Dec. 12, 1984). For example, one of the memory cells comprises a field effect transistor (FET) and a trench-capacitor, as shown in FIG. 9 of EP-A-No. 0145606 (corresponding to U.S. Ser. No. 681,290). In the drawing, the FET has a source region and a drain region which are formed in a semiconductor substrate, and the capacitor comprises a dielectric (insulation) layer formed on the groove surface, an upper capacitor electrode (conductive layer) formed on the dielectric layer and connecting with the drain region, and a lower capacitor electrode which is a diffusion region formed in the substrate and along the groove surface. In this case, the SOI structure is not adopted in the memory device, so that the parasitic capacitance affects the memory device. Furthermore, the restrictions of integration prevent an electrode connecting with the diffusion region of the lower capacitor electrode from forming, so that a low level voltage cannot be applied to the lower capacitor electrode. Accordingly, the capacitor is supplied with a supply voltage $V_{CC}$ or a total voltage of $V_{CC}$ and a substrate bias voltage. When the capacitor using a thin dielectric (insulation) layer is supplied with such a voltage, degradation of the reliability of the thin dielectric layer becomes a problem, and as a result, the reliability of the memory device is degraded.

SUMMARY OF THE INVENTION

An object of the present invention is to provide improved one-transistor and one-capacitor type memory cells for a DRAM device.

Another object of the present invention is to provide a DRAM device comprising memory cells, each of which is composed of an FET having the SOI structure and a capacitor using a thin dielectric layer, without any degradation of reliability.

The above-mentioned and other objects of the present invention are attained by providing a semiconductor memory device having memory cells, each of which is composed of a transistor and capacitor, according to the present invention. The transistor is formed in a semiconductor layer which is formed on an insulating layer formed on a semiconductor substrate. The capacitor is composed of a dielectric layer which is the insulating layer, an upper capacitor electrode which is the semiconductor layer and a lower capacitor electrode which is the semiconductor substrate. The substrate is biased with a voltage at an intermediate level between a first storage voltage and a second storage voltage.

According to the present invention, the transistor is made in the SOI structure and is not formed in the substrate, whereby the substrate as the lower capacitor electrode can be biased with the intermediate level voltage. Therefore, the voltage applied across the upper capacitor electrode of the semiconductor layer and the lower capacitor electrode of the substrate is decreased by the intermediate bias voltage to a level lower than in the above-mentioned prior art case. Namely, the electric field strength in the dielectric layer is decreased, and as a result, the reliability of the dielectric layer of the capacitor is increased.

The SOI structure provides a reduced parasitic capacitance, and therefore, the transistor has a higher operating speed. Accordingly the memory device can operate at a higher speed than that of a memory device not having the SOI structure.

It is possible to use a semiconductor substrate of a first conductivity type having a well (doped) region of a second conductivity type, which is formed in the surface portion of the substrate and serves as the lower capacitor electrode of the capacitor. The second conductivity type is opposite that of the first conductivity type. In this case, the memory cell is disposed on the well region and a peripheral circuit of the memory cells has a conventional structure and is formed in the substrate outside the well region. $V_{CC}$ (0 V) or a minus voltage can be adopted for the substrate voltage as usual, which ensures a stable performance of the peripheral circuit.

BRIEF DESCRIPTION OF THE DRAWINGS

The present invention will become more apparent from the description of the preferred embodiments set forth below with reference to the accompanying drawings, in which.

DESCRIPTION OF THE PREFERRED EMBODIMENTS

Figure 1A:
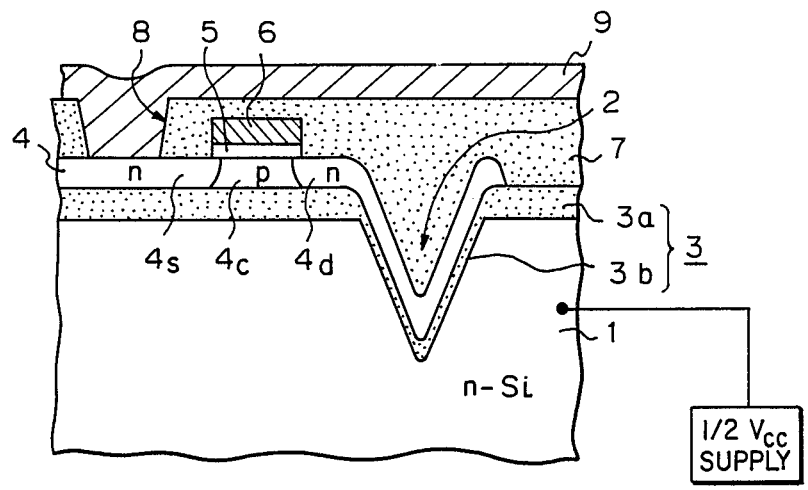
FIG. 1A is a partial sectional view of a memory cell of a DRAM device according to the present invention.
Figure 1B:
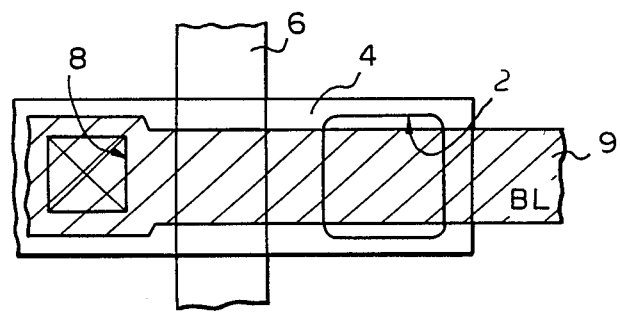
FIG. 1B is a partial plan view of the memory cell shown in FIG. 1A.

Referring to FIGS. 1A and 1B, a DRAM device according to the present invention comprises memory cells, each of which is composed of an FET and a trench-capacitor.

In the drawings, a semiconductor substrate 1 is, for example, an n-type silicon single crystalline substrate, and has a V-groove 2 for the trench-capacitor. An insulating layer 3 of, e.g., silicon dioxide ($SiO_2$), is formed on the substrate 1 and consists of a thick portion 3a and a thin portion 3b. A semiconductor layer 4 of, e.g., polycrystalline silicon, is formed on the insulating layer 3.

A gate insulating layer 5 of, e.g., $SiO_2$, and a gate electrode 6 of, e.g., polycrystalline silicon (i.e., a word line) are formed on the semiconductor layer 4 above the thick insualting layer portion 3a. The FET is composed of the gate insulating layer 5, the gate electrode 6, an n-type source region 4s, an n-type drain region 4d, and a p-type channel region 4c. These regions 4s, 4d, and 4c are formed in the semiconductor layer 4. Thus, the FET has the SOI structure. The trench-capacitor is composed of a dielectric (insulation) layer of the thin semiconductor layer portion 3b, an upper capacitor electrode of the portion of the semiconductor layer 4, and a lower capacitor electrode of the substrate 1. The electric charge for information is stored in the thin insulating layer portion 3b. An insulating layer 7 of, e.g., $SiO_2$ is formed over the entire surface and has a contact hole 8 wherein a portion of the source region 4s is exposed. In FIG. 1B the layer 7 is omitted. A conductive layer 9 of, e.g., aluminum (i.e., a bit line) is formed on the insulating layer 7 and is connected with the source region 4s.

In the memory cell having the above-mentioned structure, since the FET is isolated from the substrate 1, the substrate 1 can be biased with a suitable (intermediate) voltage for the capacitor between a first storage voltage (practically the supply voltage $V_{CC}$ of, e.g., 5 V) for high level information, and a second storage voltage (practically, the ground voltage of 0 V) for low level information. For example, where $V_{CC}$ is +5 V, it is preferable to bias the substrate 1 with +2.5 V, i.e., ½ $V_{CC}$. Accordingly, the capacitor is supplied with 2.5 V. In a conventional memory device, since a substrate is usually biased with the ground voltage or a minus voltage of from −2 to −3 V, a capacitor is supplied with a voltage of 5 V or 7 to 8 V. Thus compared with the conventional device, it is possible to substantially decrease an electric field strength in the dielectric layer of the capacitor.

FETs of a peripheral circuit of a memory device may have the SOI structure and be formed by using the polycrystalline silicon layer 4 on the thick $SiO_2$ layer 3a.

The memory device of FIGS. 1A and 1B is produced in the following manner.

An n-type single crystalline silicon substrate 1 is thermally oxidized to form a thick $SiO_2$ layer 3a. The $SiO_2$ layer 3a is selectively etched to expose a portion of the substrate 1. The exposed portion is anisotropically etched to form a V-groove 2 or a U-groove. The substrate 1 is thermally oxidized to form a thin $SiO_2$ layer 3b on the groove surface. Then, a p-type polycrystalline silicon layer 4 is deposited over the entire surface by a chemical vapor deposition (CVD) method and is patterned by an etching method. In order to form a thin $SiO_2$ layer including a gate insulating layer 5 on the polycrystalline silicon layer 4, a thermal oxidation treatment is carried out. A polycrystalline silicon layer is formed over the exposed surface by a CVD method and is then selectively etched to form a word line 6 including a gate electrode. Donor impurities (e.g., phosphorous) are implanted in the polycrystalline silicon layer 4 by an ion-implantation method to form an n-type source region 4s and an n-type drain region 4d. An $SiO_2$ layer 7 is then formed over the entire surface and is selectively etched to form a contact hole 8. An aluminum layer is formed on the $SiO_2$ layer 7 and is patterned by etching to form a bit line 9 connecting with the n-type source region 4s. Thus the memory cell having the FET and the trench-capacitor is obtained, as shown in FIG. 1A.

Figure 2:
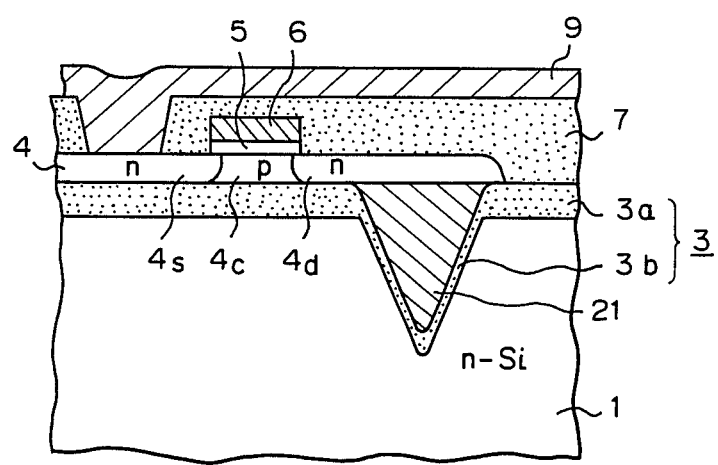
FIG. 2 is a partial sectional view of a memory cell of a DRAM device according to another embodiment of the present invention.

A memory device according to another embodiment of the present invention is illustrated in FIG. 2. In this case, a semiconductor layer 4 is of a single crystalline silicon and the V-groove is filled with a polycrystalline silicon filler 21. In FIG. 2, the same reference numerals as those shown in FIGS. 1A and 1B indicate the same portions.

The device is produced in a similar manner to the above-mentioned production manner of the device shown in FIGS. 1A and 1B, except for the formation of the polycrystalline silicon filler 21 and single-crystallization of the semiconductor layer 4. After the formation of the thin $SiO_2$ layer 3b, a polycrystalline silicon layer is deposited over the entire surface by a CVD method so as to fill the V-groove, and then is selectively removed by a suitable etching method, to form a substantially flat surface, as shown in FIG. 2. A polycrystalline silicon layer is deposited over the entire flat surface by a CVD method, and is recrystallized by applying a laser beam to form a single crystalline silicon layer. The single crystalline silicon layer is patterned by etching to obtain the semiconductor layer 4 of single crystalline silicon.

If the V-groove is not filled with polycrystalline silicon filler, and thus a polycrystalline silicon layer which is not flat is heated by the laser beam, the polycrystalline silicon layer will melt and a portion thereof will flow to the bottom of the V-groove to accumulate therein. As a result, the silicon layer separate into portions on the thick $SiO_2$ layer 3a and in the bottom of the V-groove, respectively, so that an upper capacitor electrode cannot be formed.

In this case, since the FET is made by using the single crystalline silicon layer, the performance of the FET is better than taht of the FET which is made by using the polycrystalline silicon layer.

Figures 3A, 3B:
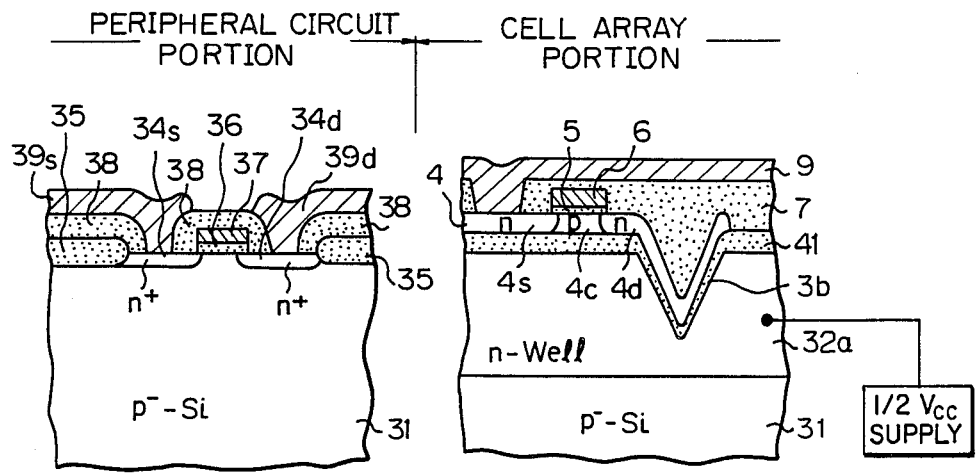
FIG. 3A is a partial sectional view of a memory cell of a DRAM device according to still another embodiment of the present invention.
FIG. 3B is partial sectional view of an FET of a peripheral circuit of a DRAM device comprising the memory cell shown in FIG. 3A.
Figure 3C:
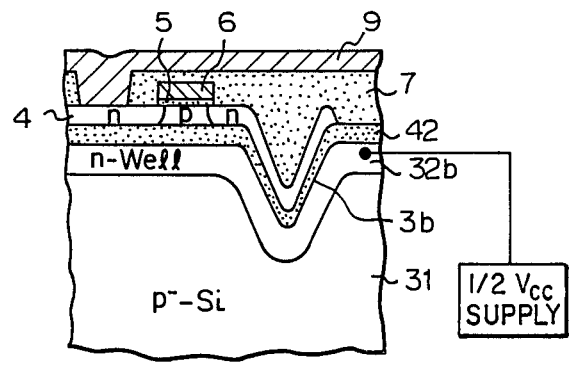
FIG. 3C is a partial sectional view of a memory cell similar to that shown in FIG. 3A.

A memory device according to still another embodiment of the present invention is illustrated in FIGS. 3A, 3B and 3C. In this case, an n-type well portion 32a, 32b is formed in a p⁻-type silicon single crystalline substrate 31 and serves as the lower capacitor electrode. The well portion 32a or 32b is biased with the intermediate voltage (e.g., +2.5 V) through a conductor line connecting therewith. The p⁻-type substrate can be biased with the ground voltage (0 V) or a minus voltage (e.g., −2 to −3 V), so that an FET of the peripheral circuit of the DRAM device is conventionally formed by using the p-type substrate, as shown in FIG. 3B. The performance of such an FET is better than that of the FET having the SOI structure, since the crystal properties of the p⁻-type substrate are better than those of the semiconductor layer having the SOI structure.

In FIG. 3B, a source (n+-type) region 34s and a drain (n+-type) region 34d of the FET are formed directly in the p⁻-type substrate 31. A field (thick) insulating (SiO₂) layer 35 and a gate insulating (thin SiO₂) layer 36 are formed on the substrate 31. A gate electrode 37 made of, e.g., polycrystalline silicon, is formed on the gate insulating layer 36. Another insulating (SiO₂) layer 38 covers the entire surface and has contact holes therein. A source electrode 39s and a drain electrode 39d of, e.g., aluminum, are formed.

The memory cell shown in FIG. 3A is produced in the following manner.

Donor impurities (e.g., phosphorous) are selectively implanted in the p+-type substrate by an ion-implantation method. The substrate is thermally oxidized to form a thick insulating SiO₂ layer 41, and to simultaneously form the n-type well protion 32a, by diffusion. Then the thick SiO₂ layer 41 is selectively etched, and the p⁻-type substrate 31 is anisotropically etched to form a V-groove. The flow of the production steps is similar to those mentioned for the cell shown in FIGS. 1A and 1B. The same reference numerals in FIG. 3A as these shown in FIGS. 1A and 1B indicate the same portions.

Where the V-groove is deep, it is necessary to make the depth of the well region deeper than the groove. However, it is difficult to form a very deep well region. To solve this problem, the structure of FIG. 3C is adopted instead of that of FIG. 3A.

In this case, the n-type well region 32b is formed in two steps. Donor impurities (e.g., phosphorous) are selectively but not so deeply implanted in the p⁻-type substrate by an ion-implantation method. The substrate is thermally oxidized to form a thick SiO₂ layer 42, and simultaneously, to form a portion of the well region 32b, which extends toward but does not reach the bottom peak of the V-groove. Then the thick SiO₂ layer 42 is selectively etched, and the substrate 31 is anisotropically etched to form the V-groove extending through the formed well region portion. Donor impurities are introduced into the substrate 31 from the V-groove surface by a thermal diffusion method, to form another portion of the well region 32b which is along the V-groove surface. Thus, the n-type well region 32b shown in FIG. 3C is obtained. The following production steps are similar to those mentioned for the cell shown in FIGS. 1A and 1B, and the same reference numerals in FIG. 3C as those in FIGS. 1A and 1B indicate the same portions.

As explained above, according to the present invention, the adoption of the SOI structure can increase the speed of operation of device, decrease an electric field strength applied to a capacitor with a thin dielectric layer, and improve the reliability of the device.

It will be obvious that the present invention is not limited to the above-mentioned embodiments and that many variations are possible for persons skilled in the art without departing from the scope of the invention.

I claim:

1. A semiconductor memory device comprising:
   a transistor formed in a semiconductor layer which is formed on an insulating layer, said insulating layer being formed on a well region formed in a semiconductor substrate, said semiconductor substrate being a first conductivity type, said well region being a second conductivity type opposite to said first conductitivy type, said transistor having a silicon on insulator structure where said silicon corresponds to said semiconductor layer and said insulator corresponds to said insulating layer; and
   a capacitor composed of a dielectric layer formed from said insulating layer, an upper capacitor electrode formed from said semiconductor layer, and a lower capacitor electrode formed from said well region wherein said dielectric layer is sandwiched between said upper and lower capacitor electrodes; the well region having a reverse bias to that of said substrate and being biased with a voltage at an intermediate level between a first storage voltage and a second storage voltage.

2. A semiconductor memory device according to claim 1, wherein said transistor is field effect transistor comprising a source region and a drain region formed in said semiconductor layer and a gate electrode formed on a gate insulating layer on said semiconductor layer.

3. A semiconductor memory device according to claim 1, wherein the dielectric layer of said capacitor is a thin portion of said insulating layer which is thinner than a remaining portion of said insulating layer.

4. A semiconductor memory device according to claim 3, wherein said capacitor is a trench type.

5. A semiconductor memory device according to claim 4, wherein said thin portion of said insulating layer is formed on a groove surface of said trench, and said semiconductor layer is composed of a polycrystalline silicon portion formed on said insulating layer.

6. A semiconductor memory device according to claim 2, wherein said semiconductor layer is a polycrystalline silicon layer.

7. A semiconductor memory device according to claim 2, wherein said semiconductor layer is a single crystalline silicon layer.

8. A semiconductor memory device according to claim 1, wherein said second storage voltage is a supply voltage and said first storage voltage is a ground voltage.

9. A semiconductor memory device according to claim 8, wherein said intermediate level voltage is a half of the supply voltage.

10. A semiconductor memory device comprising:
    a semiconductor substrate of a first conductivity type;
    a well region of a second conductivity type, opposite said first conductivity type, disposed in a surface portion of said semiconductor substrate;
    an insulating layer composed of a first portion and a second portion and formed on said semiconductor substrate, said first portion being thinner than said second portion;
    a semiconductor layer formed on said insulating layer;
    a transistor formed in said semiconductor layer, said transistor having a silicon on insulator structure, where said silicon corresponds to said semiconductor layer and said insulator corresponds to said second portion of said insulating layer;
    a capacitor composed of a dielectric layer of said first portion of said insulating layer, an upper capacitor electrode formed from said semiconductor layer, and a lower capacitor electrode formed from said well portion wherein said dielectric layer is sandwiched between said upper capacitor electrode and said lower capacitor electrode; said well region having a reverse bias to that of said substrate, said well region being biased with an intermediate voltage between a first storage voltage and a second storage voltage.

11. A semiconductor memory device according to claim 10, wherein said transistor is a field effect transistor comprising a source region and a drain region formed in said semiconductor layer and a gate electrode formed on a gate insulating layer on said semiconductor layer.

12. A semiconductor memory device according to claim 10, wherein said capacitor is a trench type.

13. A semiconductor memory device according to claim 11, wherein said semiconductor layer is a polycrystalline silicon layer.

14. A semiconductor memory device according to claim 11, wherein said semiconductor layer is a single crystalline silicon layer.

15. A semiconductor memory device according to claim 10, wherein said second storage voltage is a supply voltage and said first storage voltage is a ground voltage.

16. A semiconductor memory device according to claim 15, wherein said intermediate voltage is a half of the supply voltage.

* * * * *